(12) United States Patent
Yuan et al.

(10) Patent No.: US 10,027,297 B2
(45) Date of Patent: Jul. 17, 2018

(54) VARIABLE GAIN AMPLIFIER WITH COUPLED DEGENERATION RESISTANCE AND CAPACITANCE

(71) Applicant: QUALCOMM Incorporated, San Diego, CA (US)

(72) Inventors: Xiaobin Yuan, Cary, NC (US); Jacob Lee Dahle, Raleigh, NC (US); Mangal Prasad, Raleigh, NC (US); Joseph Natonio, Wappingers Falls, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/268,264

(22) Filed: Sep. 16, 2016

(65) Prior Publication Data

US 2018/0083584 A1    Mar. 22, 2018

(51) Int. Cl.
  *H03G 1/00*    (2006.01)
  *H03F 3/45*    (2006.01)
  *H03F 3/191*   (2006.01)

(52) U.S. Cl.
  CPC ......... *H03G 1/007* (2013.01); *H03F 3/45179* (2013.01)

(58) Field of Classification Search
  USPC ................................. 330/252–261, 283, 304
  See application file for complete search history.

(56) References Cited

U.S. PATENT DOCUMENTS

| | | | |
|---|---|---|---|
| 6,316,997 B1* | 11/2001 | Tammone, Jr. ...... | H03G 1/0029 330/254 |
| 6,664,853 B1* | 12/2003 | Sun ..................... | H03F 3/45197 330/252 |
| 6,771,124 B1 | 8/2004 | Ezell | |
| 7,562,108 B2* | 7/2009 | Singh ................ | H04L 25/03878 708/819 |
| 7,567,126 B2 | 7/2009 | Arai | |
| 7,598,811 B2* | 10/2009 | Cao ..................... | H03F 3/45183 330/254 |
| 7,656,939 B2 | 2/2010 | Gondi et al. | |
| 7,894,772 B2 | 2/2011 | Aoki | |
| 7,956,687 B2 | 6/2011 | Vakilian | |
| 9,419,573 B2 | 8/2016 | Brekelmans et al. | |

(Continued)

OTHER PUBLICATIONS

Choi Y., et al., "A 10-Gb/s Receiver with a Continuous-Time Linear Equalizer and 1-Tap Decision-Feedback Equalizer", IEEE 58th International Midwest Symposium on Circuits and Systems (MWSCAS), 2015, 4 Pages.

(Continued)

*Primary Examiner* — Hieu Nguyen
(74) *Attorney, Agent, or Firm* — Loza & Loza, LLP/Qualcomm

(57) ABSTRACT

One aspect of the present disclosure relates to a method for operating an amplifier, the amplifier including a variable resistor coupled between a source of a first input transistor and a source of a second input transistors, and a variable capacitor coupled between the source of the first input transistor and the source of the second input transistor. The method includes adjusting a resistance of the variable resistor to adjust a low-frequency gain of the amplifier, and adjusting a capacitance of the variable capacitor in an opposite direction as the adjustment to the resistance of the variable resistor.

30 Claims, 14 Drawing Sheets

(56) References Cited

U.S. PATENT DOCUMENTS

| | | |
|---|---|---|
| 2004/0239369 A1 | 12/2004 | Hsu et al. |
| 2005/0040864 A1 | 2/2005 | Ficken et al. |
| 2008/0048736 A1 | 2/2008 | Ruy |
| 2009/0129485 A1 | 5/2009 | Hsu et al. |
| 2009/0302888 A1 | 12/2009 | Shumarayev et al. |
| 2011/0169574 A1 | 7/2011 | Bi |
| 2013/0207722 A1 | 8/2013 | Bulzacchelli et al. |
| 2014/0010333 A1 | 1/2014 | Cohen |
| 2016/0020740 A1 | 1/2016 | Arcudia et al. |

OTHER PUBLICATIONS

Xiu L., et al., "A "Flying-Adder" Frequency Synthesis Architecture of Reducing VCO Stages", IEEE Transactions on Very Large Scale Integration (VLSI) Systems, Feb. 2005, vol. 13, No. 2, pp. 201-210.
International Search Report and Written Opinion—PCT/US2017/047741—ISA/EPO—dated Nov. 21, 2017.

* cited by examiner

VARIABLE GAIN AMPLIFIER WITH COUPLED DEGENERATION RESISTANCE AND CAPACITANCE

BACKGROUND

Field

Aspects of the present disclosure relate generally to amplifiers, and more particularly, to variable gain amplifiers.

Background

In a communication system, signals may be transmitted from a transmitting device to a receiving device across a channel (e.g., transmission line, cable, wire, etc.). The channel may be bandwidth limited, in which the channel attenuates signals at high frequencies. The frequency-dependent attenuation can cause distortions in signals transmitted across the channel, especially high frequency signals. To address this, the receiving device may include an amplifier with gain peaking at high frequencies (also referred to as an equalizer) to compensate for the signal attenuation at high frequencies.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, a system is provided. The system includes an amplifier and a controller. The amplifier includes a first input transistor, a first load coupled between a drain of the first input transistor and a supply voltage, a second input transistor, a second load coupled between a drain of the second input transistor and the supply voltage, a variable resistor coupled between a source of the first input transistor and a source of the second input transistor, and a variable capacitor coupled between the source of the first input transistor and the source of the second input transistor. The controller is configured to adjust a resistance of the variable resistor to adjust a low-frequency gain of the amplifier, and to adjust a capacitance of the variable capacitor in an opposite direction as the adjustment to the resistance of the variable resistor.

A second aspect relates to a method for operating an amplifier, the amplifier including a variable resistor coupled between a source of a first input transistor and a source of a second input transistor, and a variable capacitor coupled between the source of the first input transistor and the source of the second input transistor. The method includes adjusting a resistance of the variable resistor to adjust a low-frequency gain of the amplifier, and adjusting a capacitance of the variable capacitor in an opposite direction as the adjustment to the resistance of the variable resistor.

A third aspect relates to an apparatus for operating an amplifier, the amplifier including a variable resistor coupled between a source of a first input transistor and a source of a second input transistor, and a variable capacitor coupled between the source of the first input transistor and the source of the second input transistor. The apparatus includes means for adjusting a resistance of the variable resistor to adjust a low-frequency gain of the amplifier, and means for adjusting a capacitance of the variable capacitor in an opposite direction as the adjustment to the resistance of the variable resistor.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
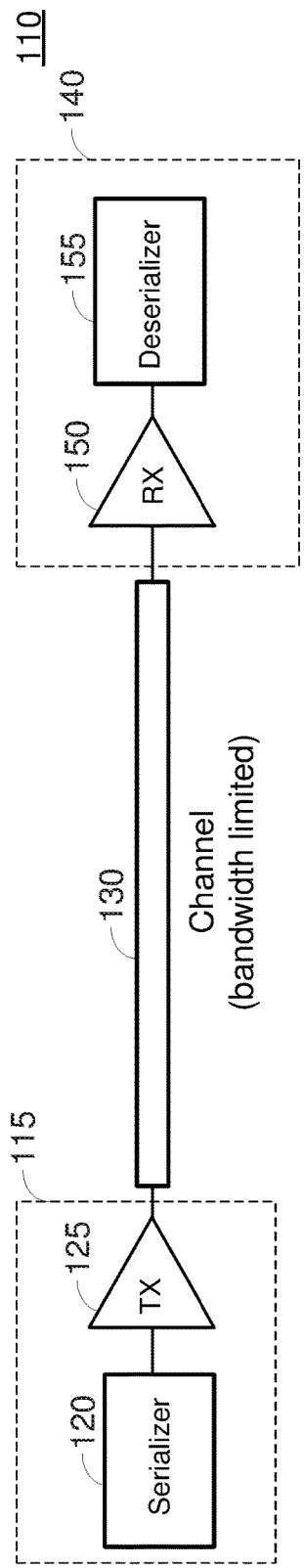
FIG. 1 shows an exemplary communication system according to certain aspects of the present disclosure.

FIG. 1 shows an example of a communication system 110 for transmitting data from a transmitting device 115 to a receiving device 140 over a channel 130. The communication system 110 may be used, for example, in a Serializer/Deserializer (SerDes) system to transmit high-speed serial data (e.g., 5 Gbits/s or higher) over the channel 130. In this regard, the transmitting device 115 may include a serializer 120 for converting parallel data streams into a high-speed serial data stream and a transmitter 125 for transmitting the serial data stream over the channel 130. The serial data stream may be transmitted as a differential signal. The receiving device 140 may comprise a receiver 150 for receiving the serial data stream from the channel 130, and a deserializer 155 for converting the serial data back into parallel data for further processing. The channel 130 may include one or more printed circuit board (PCB) traces, one or more transmission lines, a cable (e.g., a twisted-pair cable, a coaxial cable, etc.), and/or other type of channel.

Figure 2:
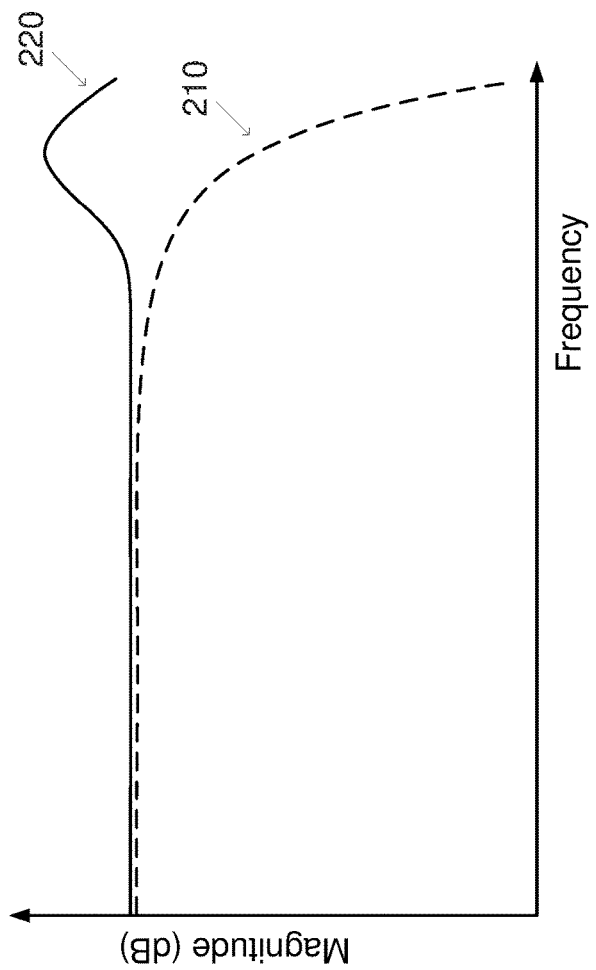
FIG. 2 is a plot showing an exemplary frequency response of a channel and an exemplary frequency response of an amplifier with gain peaking according to certain aspects of the present disclosure.

Typically, the channel 130 is bandwidth limited, which causes the channel 130 to attenuate signals at high frequencies. An example of this is illustrated in FIG. 2, which shows an exemplary frequency response 210 of the channel 130. As shown in FIG. 2, the frequency response 210 of the channel 130 rolls off at high frequencies. To compensate for the signal attenuation, the receiver 150 may include a variable gain amplifier with gain peaking. The amplifier compensates for the signal attenuation by peaking the gain of the amplifier at high frequencies. An example of this is illustrated in FIG. 2, which shows an exemplary frequency response 220 of the amplifier. As shown in FIG. 2, the gain of the amplifier peaks at high frequencies to compensate for the signal attenuation of the channel 130. This results in a combined frequency response that is approximately flat over a wider frequency band. Thus, the amplifier extends the frequency band of the communication system 110, and therefore the rate at which data can be transmitted between the transmitting device 115 and the receiving device 140.

It may be desirable to adjust the peak gain of the amplifier. For example, the receiver 150 may support different channels with different signal-attenuation characteristics. In this example, it may be desirable to adjust the peak gain of the amplifier to compensate for signal attenuation for a particular channel to provide a flat frequency response over a desired frequency band. As used herein, peak gain may refer to the maximum gain of the amplifier over a frequency range (e.g., entire frequency range or frequency band of the signal being received).

It may also be desirable to adjust the low-frequency gain of the amplifier. For example, the receiver 150 may support different received signal levels. In this example, it may be desirable to adjust the low-frequency gain of the amplifier to provide appropriate gain for a particular signal level. As used herein, low-frequency gain may refer to the gain of the amplifier at frequencies below a zero location of the amplifier, as discussed further below.

Figure 3:
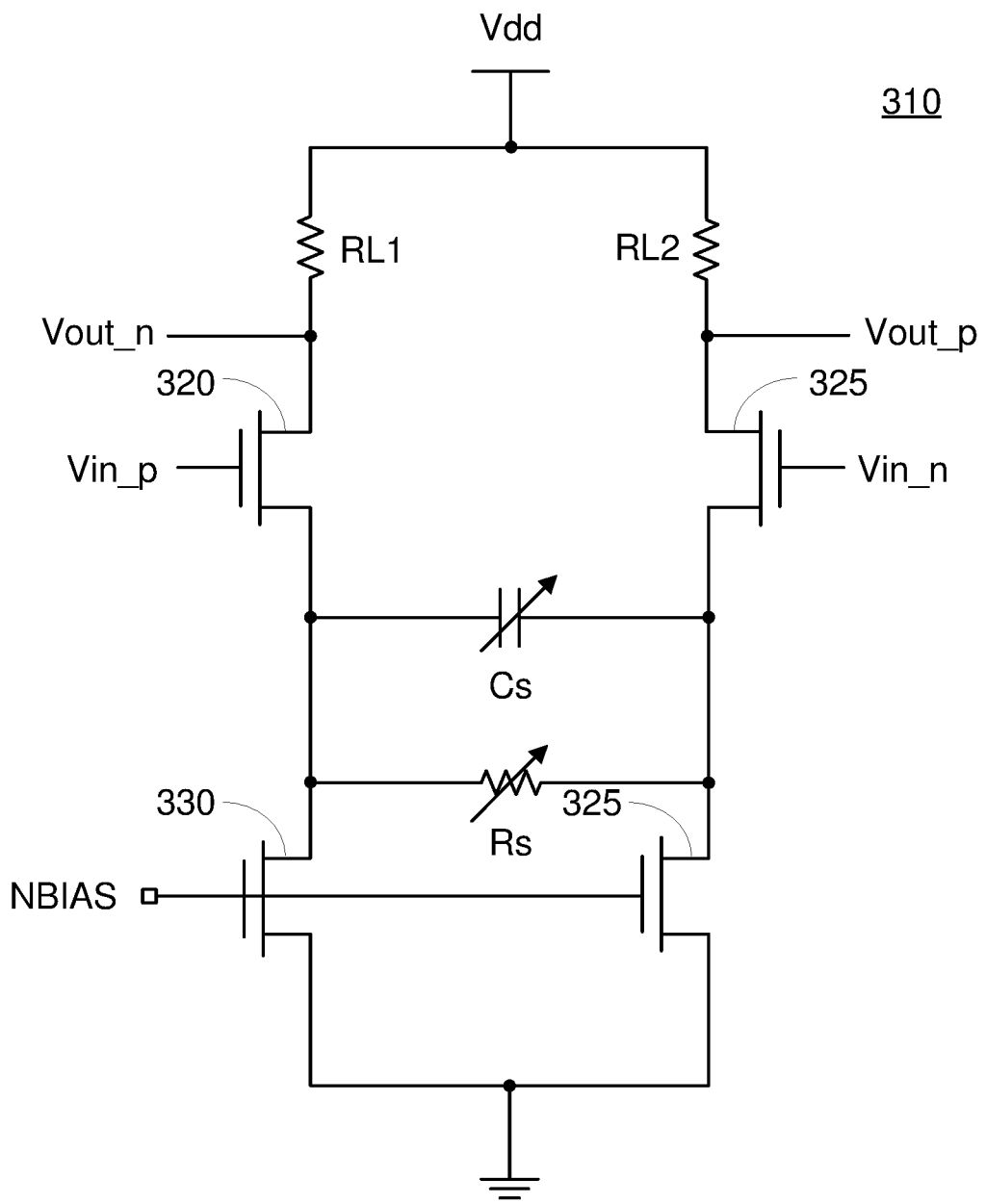
FIG. 3 shows an example of a variable gain amplifier including a variable capacitor and variable resistor according to certain aspects of the present disclosure.

FIG. 3 shows an example of a variable gain differential amplifier 310 with gain peaking at high frequencies. The amplifier 310 may be included in the receiver 150 shown in FIG. 1 for amplifying a signal received via channel 130.

The amplifier 310 includes first and second input n-type field effect transistors (NFETs) 320 and 325 for receiving a differential input signal (Vin_p and Vin_n) from the channel, first and second current-bias NFETs 330 and 335 for providing bias currents for the amplifier 310, and first and second load resistors RL1 and RL2. The first load resistor RL1 is coupled between the supply voltage Vdd and the drain of the first input NFET 320, and the second load resistor RL2 is coupled between the supply voltage Vdd and the drain of the second input NFET 325. The first current bias NFET 330 is coupled between the source of the first input NFET 320 and ground, and the second current bias NFET 335 is coupled between the source of the second input NFET 325 and ground. The gates of the first and second current-bias NFETs 330 and 335 are biased by a bias voltage (denoted "NBIAS"). The differential input signal (Vin_p and Vin_n) is received at the gates of the first and second input NFETs 320 and 325, and the differential output (Vout_p and Vout_n) of the amplifier 310 is taken at the drains of the first and second input NFETs 320 and 325, as shown in FIG. 3.

The amplifier 310 also includes a variable capacitor Cs and a variable resistor Rs coupled in parallel between the sources of the first and second input NFETs 320 and 325. At low frequencies, the resistor Rs provides a degenerative resistance at the sources of the first and second input NFETs 320 and 325, which reduces the gain of the amplifier 310 at low frequencies. For example, the low-frequency gain of the amplifier 310 may be approximately inversely proportional to the resistance of the resistor Rs. Thus, the low-frequency gain of the amplifier 310 may be adjusted by adjusting the resistance of the resistor Rs.

The impedance of the capacitor Cs decreases at high frequencies. Since the capacitor Cs is coupled in parallel with the resistor Rs, the capacitor Cs effectively shorts the resistor Rs at high frequencies, causing the gain of the amplifier 310 to increase at high frequencies. This property is used to peak the gain of the amplifier 310 at high frequencies to provide compensation for signal attenuation by the channel (e.g., channel 130) at high frequencies, as discussed further below.

Figure 4:
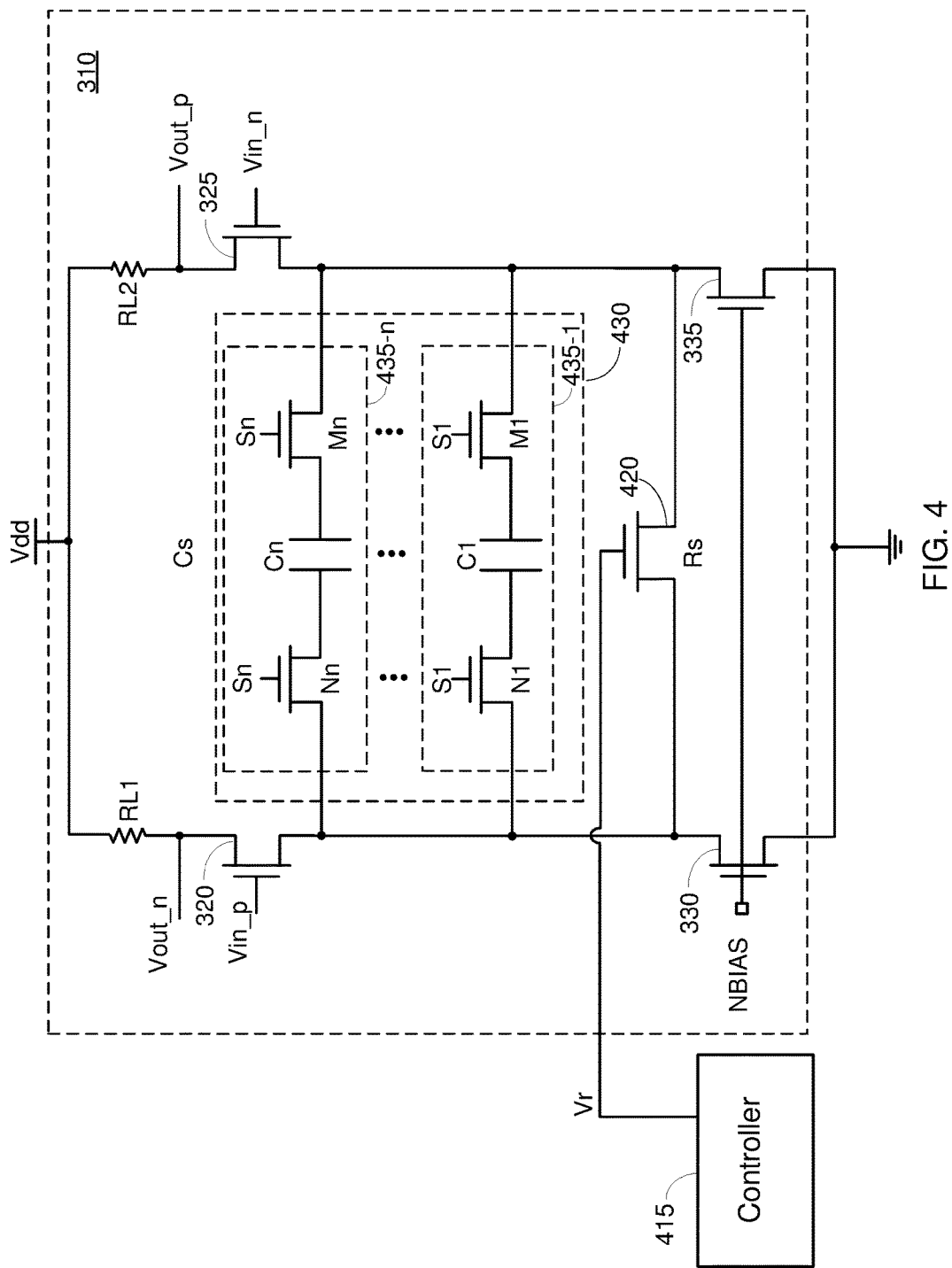
FIG. 4 shows exemplary implementations of the variable capacitor and the variable resistor according to certain aspects of the present disclosure.

FIG. 4 shows an exemplary implementation of the variable capacitor Cs and variable resistor Rs, in which the capacitance of the variable capacitor Cs and the resistance of the variable resistor Rs are controlled by a controller 415, as discussed further below.

In this example, the variable resistor Rs is implemented with an NFET resistor 420 coupled between the sources of the first and second input NFETs 320 and 325. The NFET resistor 420 is operated in the triode region such that the NFET resistor 420 acts as a voltage-controlled resistor. This allows the controller 415 to adjust the resistance of the NFET resistor 420 by adjusting a bias voltage (denoted "Vr") applied to the gate of the NFET resistor 420. In this example, the controller 415 increases the resistance of the NFET resistor 420 by decreasing the bias voltage Vr, and decreases the resistance of the NFET resistor 420 by increasing the bias voltage Vr. Since the bias voltage controls the resistance of the NFET resistor 420, the bias voltage Vr may also be referred to as a control voltage. Although an NFET resistor is used in this example, it is to be appreciated that variable resistor Rs may be implemented with another type of FET resistor (e.g., PFET resistor).

The variable capacitor Cs is implemented with a capacitor network 430 including a plurality of capacitive branches 435-1 to 435-$n$ coupled in parallel between the sources of the first and second input NFETs 320 and 325. The branches 435-1 to 435-$n$ include capacitors C1 to Cn and switches N1 to Nn and M1 to Mn. Each of the branches 435-1 to 435-$n$ includes a respective one of the capacitors C1 to Cn, a respective one of the switches N1 to Nn, and a respective one of the switches M1 to Mn. Each of the switches N1 to Nn is coupled between the source of the first input NFET 320 and the capacitor in the respective branch, and each of the switches M1 to Mn is coupled between the source of the second input NFET 325 and the capacitor in the respective branch. As shown in FIG. 4, each of the capacitors C1 to Cn is coupled between the two switches (pair of switches) in the respective branch.

The pair of switches in each branch controls whether the capacitor in the branch is switched into the capacitor network 430, and therefore whether the capacitor contributes to the total capacitance of the capacitor network 430, which is coupled between the sources of the first and second input NFETs 320 and 325. When a pair of switches in a branch is turned on, the capacitor in the branch is switched into the capacitor network 430, and therefore contributes to the capacitance of the network 430. In this case, the capacitor is coupled between the sources of the first and second input NFETs 320 and 325 by the switches in the respective branch. For instance, when the pair of switches N1 and M1 are turned on, capacitor C1 is switched into the capacitor network 430 and coupled between the sources of the first and second input NFETs 320 and 325. When a pair of switches is turned off, the capacitor in the respective branch is switched out of the capacitor network 430, and therefore does not contribute to the capacitance of the network 430. In this case, the capacitor is decoupled from the sources of the first and second input NFETs 320 and 325.

The controller 415 sets the capacitance of the capacitor network 430 by controlling the on/off states of the switches using switch signals S1 to Sn. Each of the switch signals S1 to Sn controls the on/off states of the switches in a respective one of the branches 435-1 to 435-$n$. In the example shown in FIG. 4, each switch is implemented with an NFET switch, in which the respective switch signal is applied to the gate of the NFET switch. In this example, the controller 415 turns on a pair of NFET switches (and hence switches the capacitor in the respective branch into the capacitor network 430) by asserting the respective switch signal high (e.g., approximately Vdd). The controller 415 turns off a pair of NFET switches by asserting the respective switch signal low (e.g., approximately ground). For ease of illustration, the individual connections between the controller 415 and the gates of the NFET switches are not explicitly shown in FIG. 4.

In this example, the capacitance of each individual capacitor C1 to Cn is fixed. The controller 415 adjusts the capacitance of the capacitor network 430 by controlling the number of capacitors C1 to Cn that are switched into the network 430. The larger the number of capacitors C1 to Cn that are switched into the network 430, the greater the capacitance of the network 430.

In operation, the controller 415 adjusts the low-frequency gain of the amplifier 410 by adjusting the bias voltage Vr, which controls the resistance of the NFET resistor 420. For example, the controller 415 may set the low-frequency gain of the amplifier 410 high by increasing the bias voltage Vr, which reduces the resistance of the NFET resistor 420. The controller 415 may set the low-frequency gain of the amplifier 410 low by reducing the bias voltage Vr, which increases the resistance of the resistor NFET 420. The low-frequency gain may refer to the gain of the amplifier 410 at frequencies below a zero location of the amplifier 410, in which the zero location may be approximately inversely proportional to the resistance-capacitance (RC) product of the NFET resistor 420 and the capacitor network 430.

The controller 415 adjusts the peak gain of the amplifier 410 by controlling the number of capacitors C1 to Cn that are switched into the capacitor network 430. For example, the controller 415 may increase the peak gain of the amplifier 410 by increasing the number of capacitors C1 to Cn that are switched into the capacitor network 430. As discussed above, the controller 415 switches a particular capacitor into the capacitor network 430 by turning on the pair of switches in the respective branch (i.e., same branch as the capacitor).

Figure 5A:
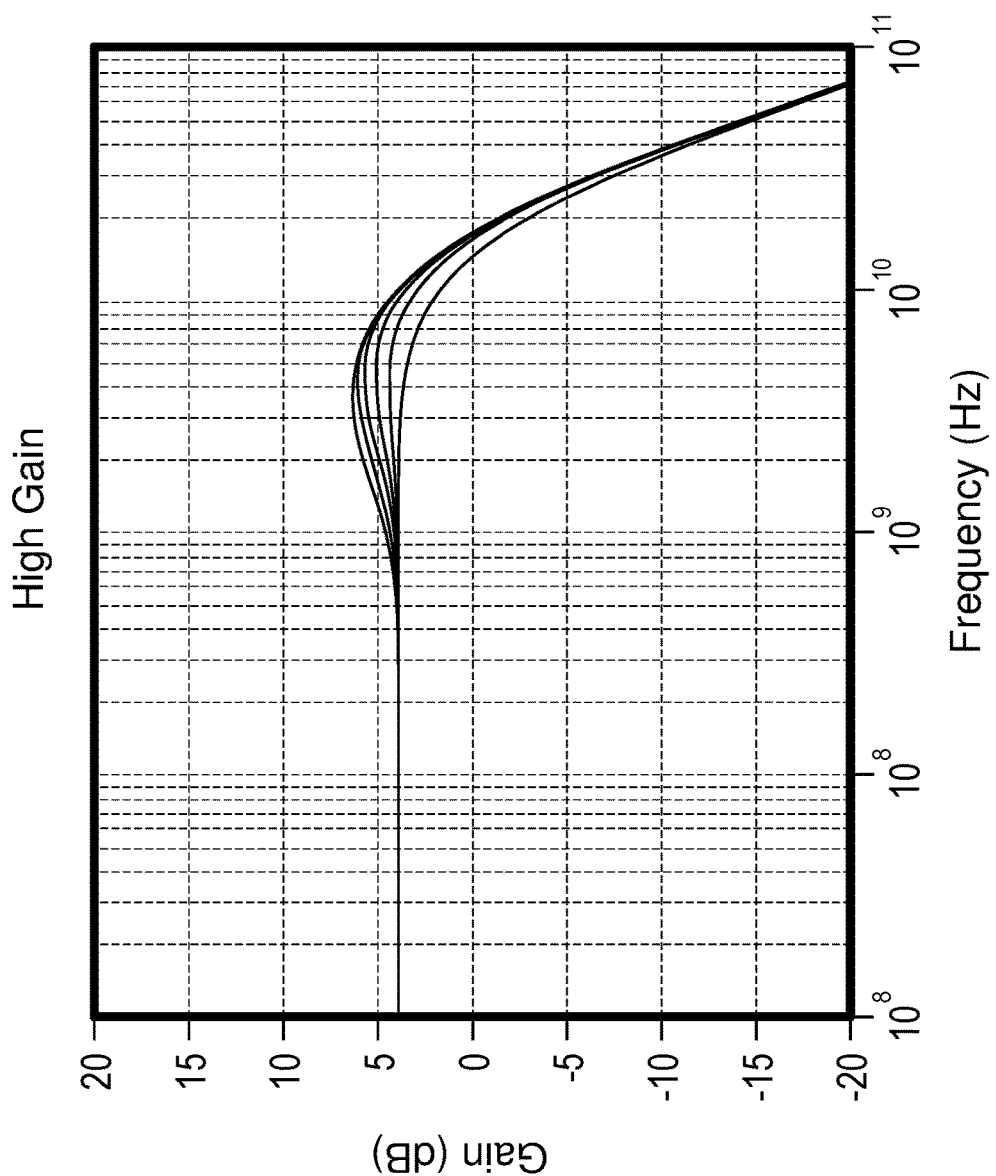
FIG. 5A is a plot showing an example of gain versus frequency for different capacitor switch settings for a case in which a low-frequency gain of the amplifier is set high according to certain aspects of the present disclosure.

FIG. 5A shows a plot of gain versus frequency for different switch settings of the capacitor network 430 for the case where the low-frequency gain of the amplifier 410 is set high, which is achieved by setting the resistance of the NFET resistor 420 low (i.e., setting the bias voltage Vr high). Each switch setting corresponds to a different number of capacitors C1 to Cn switched into the capacitor network 430, and each curve in FIG. 5A corresponds to a different one of the switch settings. As shown in FIG. 5A, the different switch settings result in different peak gains, in which increasing the number of capacitors switched into the capacitor network 430 increases the peak gain.

Figure 5B:
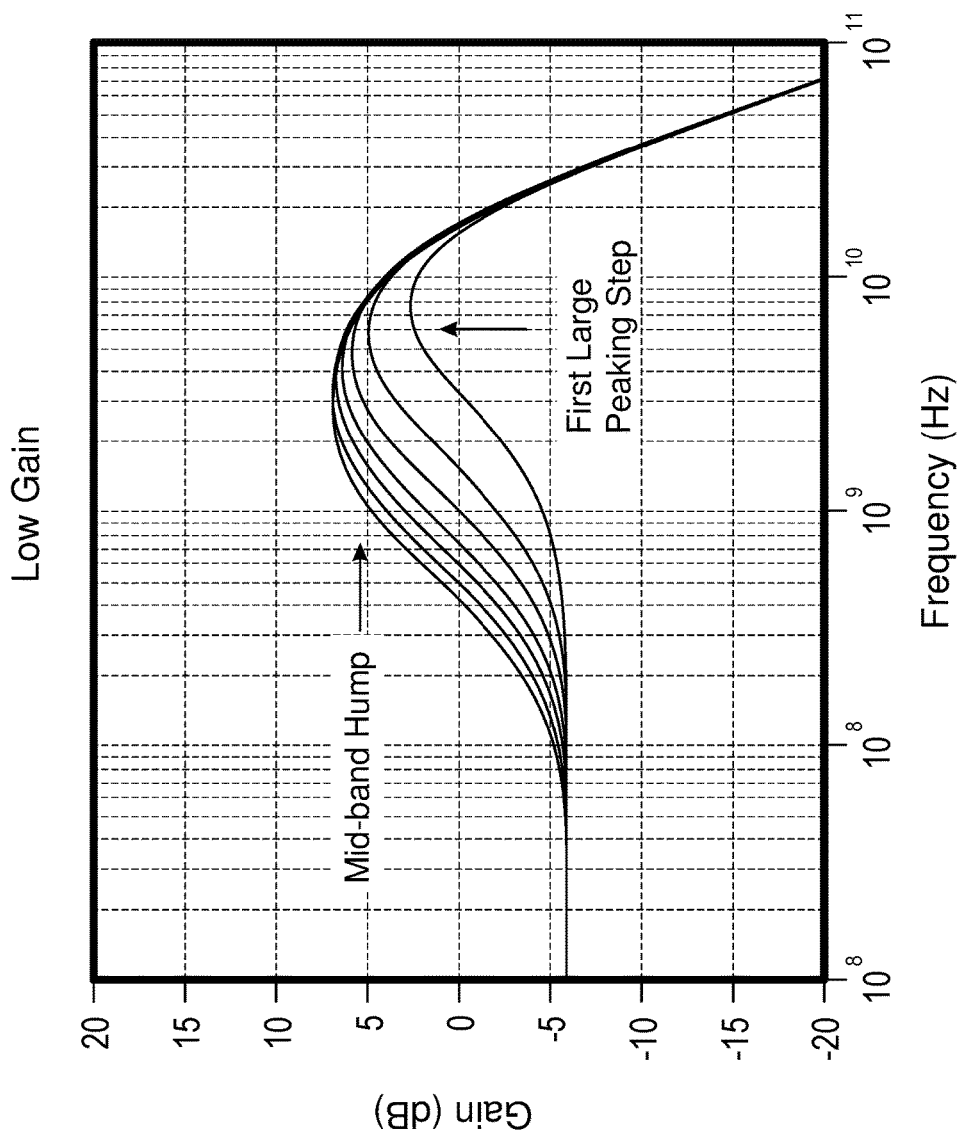
FIG. 5B is a plot showing an example of gain versus frequency for different capacitor switch settings for a case in which the low-frequency gain of the amplifier is set low according to certain aspects of the present disclosure.

FIG. 5B shows a plot of gain versus frequency for the different switch settings for the case where the low-frequency gain of the amplifier 410 is set low, which is achieved by setting the resistance of the NFET resistor 420 high (i.e., setting the bias voltage Vr low). As shown in FIG. 5B, setting the low-frequency gain of the amplifier 410 low causes the frequency locations of the peak gains to shift to the left on the frequency axis (i.e., shift toward lower frequency) compared with FIG. 5A. This causes some of the peak gains to move into the mid-frequency band, resulting in mid-band humps, as shown in FIG. 5B. The locations of the peak gains shift to the left because the location of each peak gain depends on the zero location set by the RC product of the capacitor network 430 and the NFET resistor 420. Increasing the resistance of the NFET resistor 420 to reduce the low-frequency gain of the amplifier 410 increases the RC product, which causes the zero location set by the RC product to shift to the left (i.e., shift toward lower frequency). This, in turn, causes the locations of the peak gains to shift to the left (and at least some of the peak gains to shift into the mid-frequency band). The peak gain for the maximum switch setting (i.e., all of the capacitors C1 to Cn switched into the network 430) is the farthest to the left on the frequency axis.

Peak gains in the mid-frequency band are typically undesirable because signal attenuation by a channel is typically low in the mid-band range. As a result, the peak gains in the mid-frequency band over compensate for signal attenuation by the channel, resulting in over peaking which distorts the received signal. Accordingly, it is desirable to prevent peak gains in the mid-frequency band.

In some embodiments of the present disclosure, the controller 415 is configured to selectively disable certain switch settings to prevent peak gains in the mid-frequency band, as discussed further below.

In one example, the controller 415 is configured to set the low-frequency gain of the amplifier 410 to any one of a plurality of different low-frequency gain settings, in which each low-frequency gain setting corresponds to a particular resistance of the variable resistor Rs. For each of the low-frequency gain settings, the controller 415 may be configured to disable one or more switch settings that would otherwise result in one or more peak gains in the mid-frequency band. Since the peak gains shift to the left on the frequency axis as the low-frequency gain is reduced, the number of switch settings that are disabled may increase as the low-frequency gain is reduced. For a particular low-frequency gain setting, the switch settings that are disabled for the gain setting are not available for the gain setting.

Table 1 below shows an example of the number of available switch settings (i.e., non-disabled switch settings) for different low-frequency gain settings. In this example, there are eight different low-frequency gain settings and eight different switch settings where each switch setting corresponds to a different number of capacitors C1 to Cn switched into the capacitor network 430. The low-frequency gain settings are numbered one through eight in Table 1 with the number one corresponding to the highest low-frequency gain setting and the number eight corresponding to the lowest low-frequency gain setting.

TABLE 1

| Gain Setting (High to Low) | Number of Available Switch Settings |
|---|---|
| 1 | 8 |
| 2 | 7 |
| 3 | 6 |
| 4 | 5 |
| 5 | 4 |
| 6 | 3 |
| 7 | 2 |
| 8 | 1 |

In this example, for the highest low-frequency gain setting (i.e., gain setting one), all eight switch settings are available. In other words, the controller 415 does not disable any of the switch settings when the amplifier 410 is set to the highest low-frequency gain setting. As shown in Table 1, the number of switch settings that are available decreases in moving from the highest low-frequency gain setting (i.e., gain setting one) to the lowest low-frequency gain setting (i.e., gain setting eight). For the lowest low-frequency gain setting, only one of the switch settings is available in this example. In other words, the controller 415 disables all but one of the switch settings.

As the number of available switch settings decreases in moving from the highest low-frequency gain setting to the lowest low-frequency gain setting, the controller 415 disables the switch settings in descending order starting with the highest switch setting (i.e., all of the capacitors C1 to Cn switched into the capacitor network 430). In the example in Table 1, only the lowest switch setting (i.e., one of the capacitors C1 to Cn switched into the capacitor network 430) is available for the lowest low-frequency gain setting. For low-frequency gain setting four in Table 1, five of the switch settings are available, meaning that the controller 415 can switch up to five of the capacitors C1 to Cn into the capacitor network 430 for this gain setting. In this example, if a desired switch setting is not available for the current low-frequency gain setting, then the controller 415 may set the switch setting of the capacitor network 430 to the highest switch setting that is available for the current gain setting.

It is to be appreciated that the number of available switch settings may be the same for two or more low-frequency gain settings.

In some embodiments of the present disclosure, mid-band humps are prevented by reducing variation in the RC product of the variable capacitor Cs and the variable resistor Rs across the tunable range of the low-frequency gain, as discussed further below.

Figure 6:
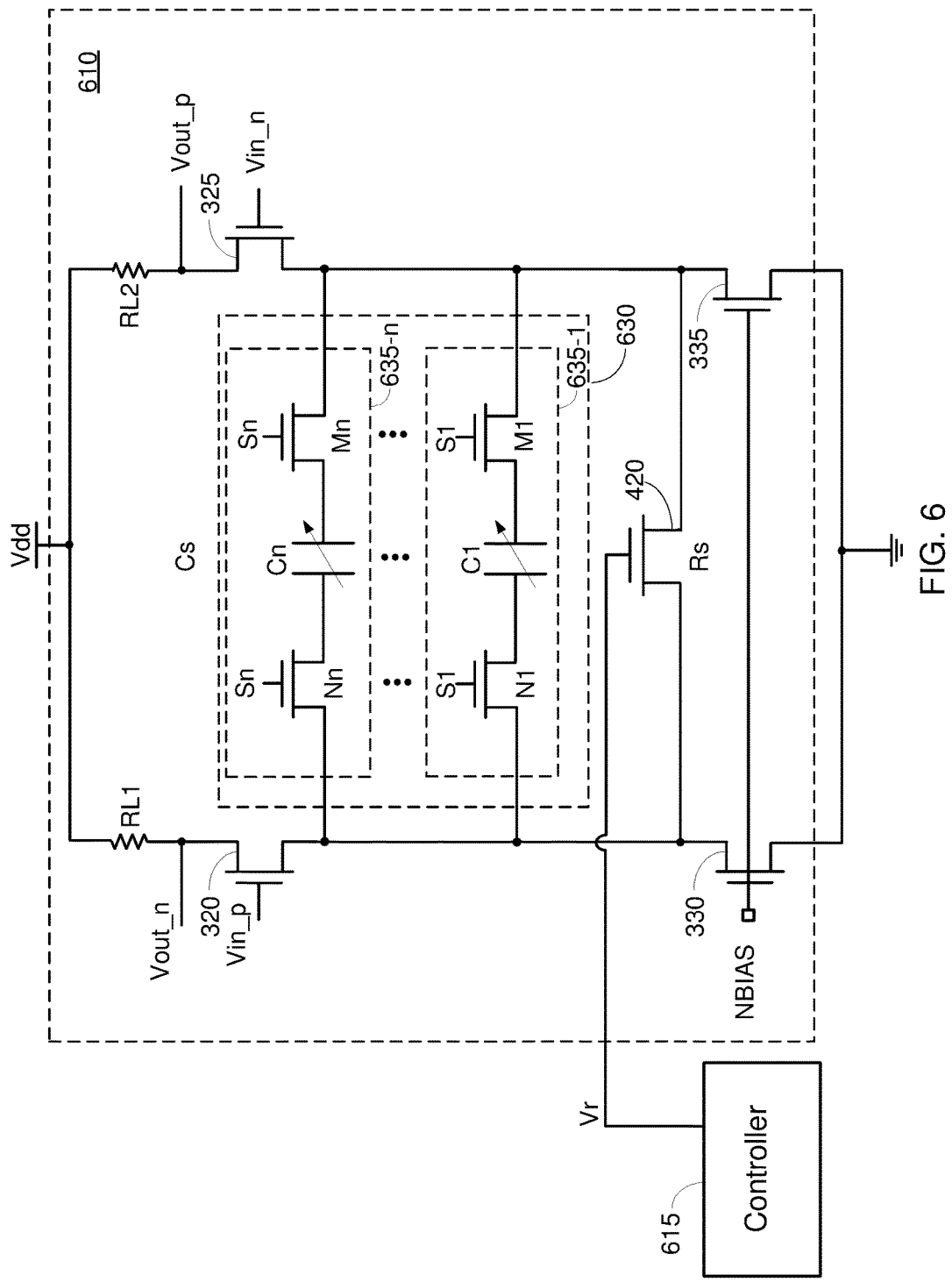
FIG. 6 shows an exemplary implementation of a capacitor network including multiple variable capacitors according to certain aspects of the present disclosure.

FIG. 6 shows a variable gain differential amplifier 610 according to aspects of the present disclosure. The amplifier 610 has components in common with the amplifier 410. For brevity, a detailed discussion of the common components is not repeated below.

Similar to the amplifier 410 in FIG. 4, the amplifier 610 includes a capacitor network 630 for adjusting the peak gain. The capacitor network 630 includes a plurality of capacitive branches 635-1 to 635-$n$ coupled in parallel between the sources of the first and second input NFETs 320 and 325. Each of the branches 635-1 to 635-$n$ includes a respective one of the capacitors C1 to Cn, a respective one of the switches N1 to Nn, and a respective one of the switches M1 to Mn, similar to the capacitor network 430 in FIG. 4. The capacitor network 630 differs from the capacitor network 430 in FIG. 4 in that each of the capacitors C1 to Cn in the capacitor network 630 is implemented with a variable capacitor instead of a fixed capacitor. This allows the controller 615 to adjust (tune) the individual capacitances of the capacitors C1 to Cn in the capacitor network 630, as discussed further below. Exemplary implementations of the variable capacitors are provided below.

Similar to the controller 415 in FIG. 4, the controller 615 adjusts the low-frequency gain of the amplifier 610 by adjusting the bias voltage Vr, which controls the resistance of the NFET resistor 420. The controller 615 also adjusts the peak gain of the amplifier 610 by controlling the number of capacitors C1 to Cn that are switched into the capacitor network 630 using switch signals S1 to Sn, same as before.

In addition to the above operations, the controller 615 is configured to reduce variation (changes) in the RC product of the variable resistor Rs (e.g., NFET resistor 420) and the capacitor network 630 for each switch setting when the low-frequency gain of the amplifier 610 changes. To do this, the controller 615 adjusts the capacitances of the variable capacitors C1 to Cn in the opposite direction as the resistance of the variable resistor Rs (e.g., NFET resistor 420) when the low-frequency gain of the amplifier 610 is changed. In other words, if the controller 615 increases the resistance of the variable resistor Rs to reduce the low-frequency gain of the amplifier 610, then the controller 615 decreases the capacitances of the variable capacitors C1 to Cn in the capacitor network 630, and, if the controller 615 decreases the resistance of the variable resistor Rs, then the controller 615 increases the capacitances of the variable capacitors C1 to Cn in the capacitor network 630. Thus, when the resistance of the variable resistor Rs is increased to reduce the low-frequency gain, the capacitances of the capacitors C1 to Cn are decreased to counter act the increase in the resistance of the variable resistor Rs to reduce the change in the RC product caused by the increase in the resistance. As a result, the change in the RC product is reduced compared with the case in FIG. 4, in which each of the capacitors C1 to Cn in the capacitor network 430 has a fixed capacitance. By reducing the change in the RC product, the controller 615 reduces the shift of the peak gains to the left on the frequency axis (i.e., shift toward lower frequency) when the low-frequency gain is reduced, and hence mitigates mid-band humps.

In certain aspects, when the controller 615 adjusts the resistance of the NFET resistor 420 to adjust the low-frequency gain, the controller 615 may also adjust the capacitances of the variable capacitors C1 to Cn such that the RC product for the maximum switch setting (i.e., all of the capacitors C1 to Cn switched into the network 630) stays within a certain RC range across the tunable range of the low-frequency gain. For example, the RC range may be small enough to ensure that the peak gain for the maximum switch setting does not move into the mid-frequency band when the amplifier 610 is set to the minimum low-frequency gain. Since the peak gain for the maximum switch setting is located the farthest to the left on the frequency axis, this also ensures that the peak gains for the other switch settings stay out of the mid-frequency band. In one example, the RC range may correspond to a change in the RC product for the maximum switch setting of 20 percent or less from a maximum low-frequency gain to a minimum low-frequency gain in the tunable range of the low-frequency gain.

In certain aspects, when the controller 615 adjusts the resistance of the NFET resistor 420 to adjust the low-frequency gain, the controller 615 may also adjust the capacitances of the variable capacitors C1 to Cn such that the RC product for the maximum switch setting stays approximately constant (fixed) across the tunable range of the low-frequency gain. As used herein the term "approximately" may correspond to a change of 5 percent or less in the RC product.

Figure 7:
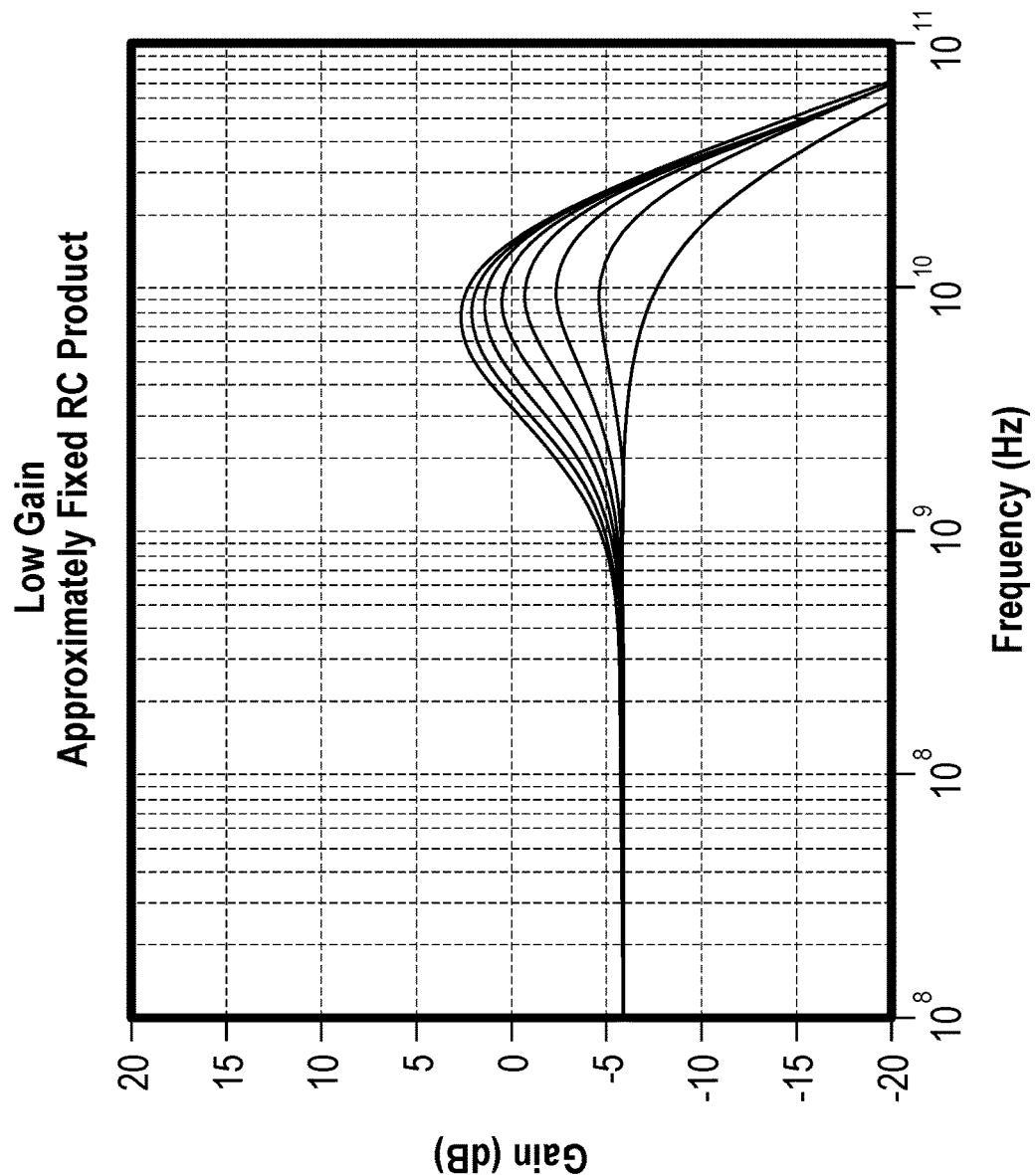
FIG. 7 is a plot showing another example of gain versus frequency for different capacitor switch settings for the case in which the low-frequency gain of the amplifier is set low according to certain aspects of the present disclosure.

FIG. 7 shows a plot of gain versus frequency for different switch settings of the capacitor network 630 for the case where the low-frequency gain of the amplifier 610 is set low. As shown in FIG. 7, by reducing variation in the RC product of the NFET resistor 420 and the capacitor network 630, the frequency shifts of the peak gains to the left (i.e., shift toward lower frequency) is significantly reduced compared with the case shown in FIG. 5B, in which each of the capacitors C1 to Cn in the capacitor network 430 has a fixed capacitance. This prevents peak gains from moving into the mid-frequency band, thereby preventing the mid-band humps shown in FIG. 5B.

In one example, the controller 615 may be configured to set the low-frequency gain of the amplifier 615 to any one of a plurality of different low-frequency gain settings, in which each low-frequency gain setting corresponds to a particular resistance of the variable resistor Rs. Since the resistance of the variable resistor Rs (e.g., NFET resistor 420) is controlled by the bias voltage Vr in the example shown in FIG. 6, each low-frequency gain setting corresponds to a particular bias voltage Vr.

In this example, each of the low-frequency gain settings has a corresponding capacitance setting for the variable capacitors C1 to Cn. Thus, when the controller 615 sets the low-frequency gain of the amplifier 615 to a particular low-frequency gain setting (sets the resistance of the variable resistor Rs to the corresponding resistance), the controller 615 sets the capacitances of the variable capacitors C1 to Cn according to the corresponding capacitance setting. The capacitance settings for the different low-frequency gain settings may be chosen such that the RC product of the variable resistor Rs and the capacitor network 630 stays within a certain RC range for the maximum switch setting (i.e., all of the capacitors C1 to Cn switched into the capacitor network 630) across the plurality of low-frequency gain settings. For example, the RC range may correspond to a change in the RC product for the maximum switch setting of 20 percent or less from the highest (maximum) one of the low-frequency gain settings to the lowest (minimum) one of the low-frequency gain settings. The number of different low-frequency settings may be four or more, six or more, or eight or more.

Figure 8:
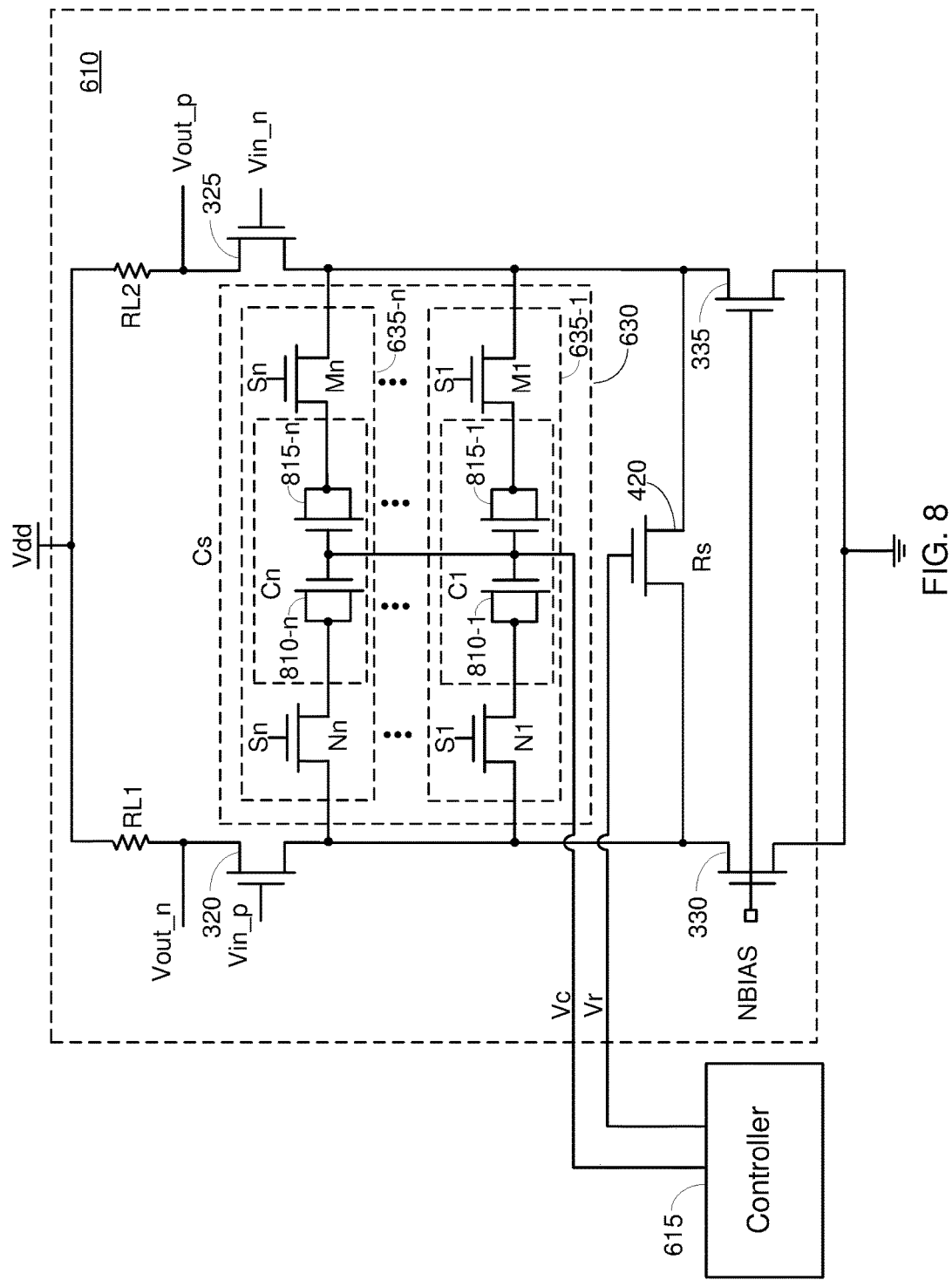
FIG. 8 shows an exemplary implementation of the variable capacitors in the capacitor network shown in FIG. 6 according to certain aspects of the present disclosure.

FIG. 8 shows an example in which the variable capacitors C1 to Cn are implemented with NFETs 810-1 to 810-n and 815-1 to 810-n. Each of the variable capacitors C1 to Cn includes a respective one of the NFETs 810-1 to 810-n, in which the source and drain of the NFET are shorted together and coupled to the respective one of the switches N1 to Nn. Each of the variable capacitors C1 to Cn also includes a respective one of the NFETs 815-1 to 815-n, in which the source and drain of the NFET are shorted together and coupled to the respective one of the switches M1 to Mn. The gates of the two NFETs of each of the variable capacitors C1 to Cn are coupled together, as shown in FIG. 8.

In this example, each of the capacitors C1 to Cn has a voltage-dependent capacitance, in which the capacitance of the capacitor is adjusted by adjusting a bias voltage (denoted "Vc") applied to the gates of the respective NFETs. Thus, in this example, the controller 615 adjusts the capacitance of each capacitor by adjusting the bias voltage Vc. The controller 615 may increase the capacitance of each capacitor in the network 630 by increasing the bias voltage Vc, and decrease the capacitance of each capacitor in the network 630 by decreasing the bias voltage Vc. Since the bias voltage Vc controls the capacitances of the capacitors C1 to Cn, the bias voltage Vc may also be referred to as a control voltage.

In this example, the controller 615 is configured to reduce variation in the RC product for each switch setting by adjusting the bias voltages Vr and Vc in the same direction. This is because the resistance of the NFET resistor 420 increases with decreasing bias voltage Vr while the capacitances of the capacitors C1 to Cn decrease with decreasing bias voltage Vc. In other words, the resistance of the NFET resistor 420 and the capacitances of the capacitors C1 to Cn respond in the opposite direction to changes in their respective bias voltages.

Thus, the controller 615 may reduce variation in the RC product of the NFET resistor 420 and the capacitor network 630 for each switch setting by adjusting the bias voltages Vr and Vc in the same direction. For example, if the controller 615 decreases bias voltage Vr (increases the resistance of the NFET resistor 420) to reduce the low-frequency gain of the amplifier 610, the controller 615 may also decrease bias voltage Vc to decrease the capacitances of the variable capacitors C1 to Cn to reduce the change in the RC product.

Figure 9:
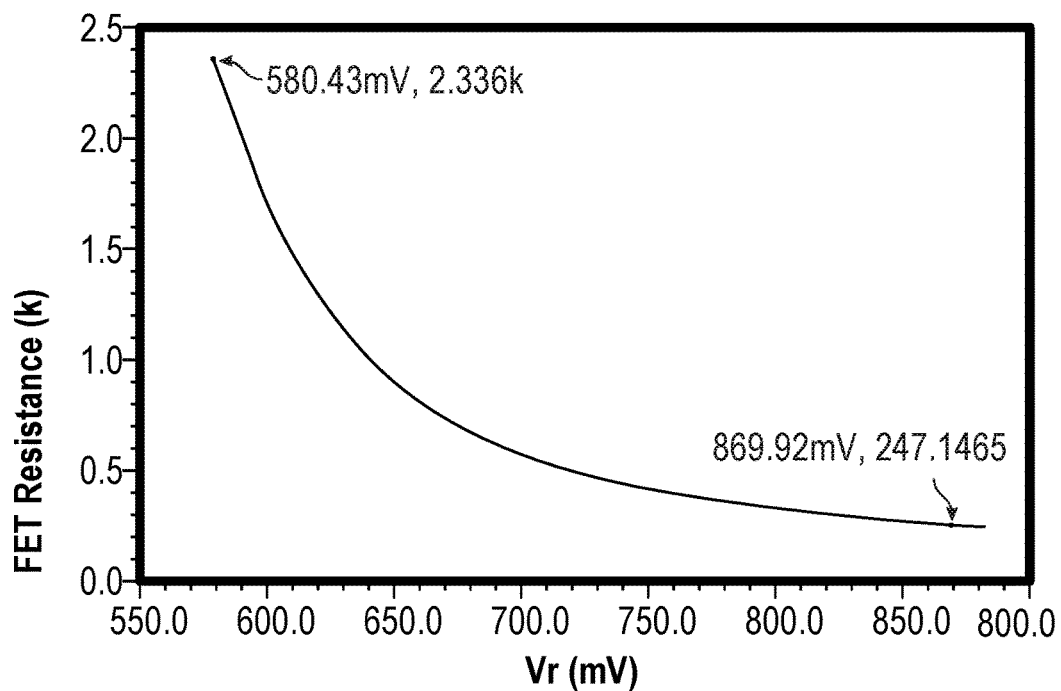
FIG. 9 is a plot showing resistance of an NFET resistor as a function of a bias voltage according to certain aspects of the present disclosure.
Figure 10:
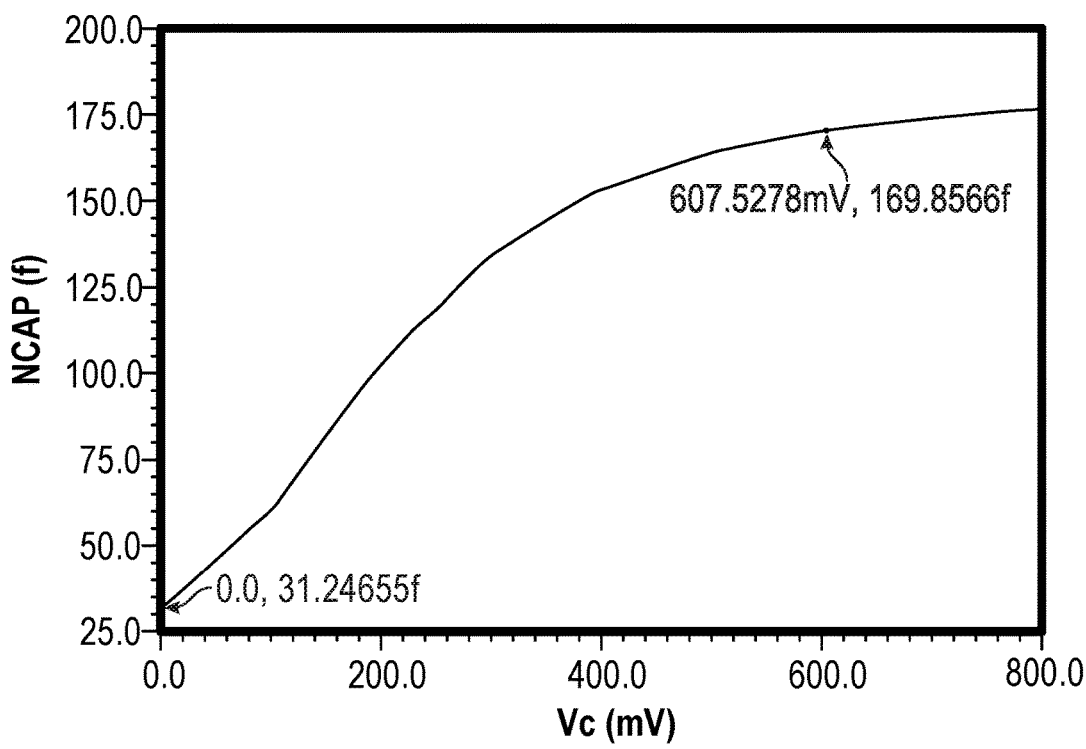
FIG. 10 is a plot showing capacitance of the capacitor network as a function of a bias voltage according to certain aspects of the present disclosure.

FIG. 9 is a plot showing an example of the resistance of the NFET resistor 420 as a function of bias voltage Vr. As shown in FIG. 9, the resistance of the NFET increases with decreasing bias voltage Vr. FIG. 10 is a plot showing an example of the capacitance of the capacitor network 630 as a function of the voltage between the gate and source/drain of each of the capacitors C1 to Cn. As shown in FIG. 10, the capacitance decreases with decreases in the voltage between the gate and source/drain of each of the capacitors C1 to Cn. The bias voltage Vc is equal to the sum of the voltage between the gate and source/drain of each of the capacitors C1 to Cn and the voltage at the source/drain of each of the capacitors C1 to Cn. A comparison of FIGS. 9 and 10 demonstrates that the resistance of the NFET resistor 420 and the capacitance of the capacitor network 630 respond in the opposite direction to changes in their respective bias voltages, and therefore that variation in the RC product of the NFET resistor 420 and the capacitor network 630 can be reduced by adjusting the bias voltages Vr and Vc in the same direction.

In one example, the controller 615 may be configured to set the low-frequency gain of the amplifier 610 to any one of a plurality of different low-frequency gain settings. Each of the low-frequency gain settings has a corresponding bias voltage Vr that sets the resistance of the NFET resistor 420 to a resistance that achieves the corresponding low-frequency gain. Each of the low-frequency gain settings also has a corresponding bias voltage Vc that sets the capacitances of the capacitors C1 to Cn in the capacitor network 630. Thus, when the controller 615 sets the low-frequency gain of the amplifier 610 to a particular low-frequency gain setting, the controller 615 sets the bias voltages of the amplifier 610 to the bias voltages Vr and Vc corresponding to the low-frequency gain setting.

The bias voltage Vc for each low-frequency gain setting may be chosen such that the RC product of the NFET resistor 420 and the capacitor network 630 for the maximum switch setting stays within a certain RC range across the plurality of low-frequency gain settings (i.e., across the tunable range of the low-frequency gain). For example, the RC range may correspond to a change in the RC product for the maximum switch setting of 20 percent or less from the highest (maximum) one of the low-frequency gain settings to the lowest (minimum) one of the low-frequency gain settings.

Figure 11:
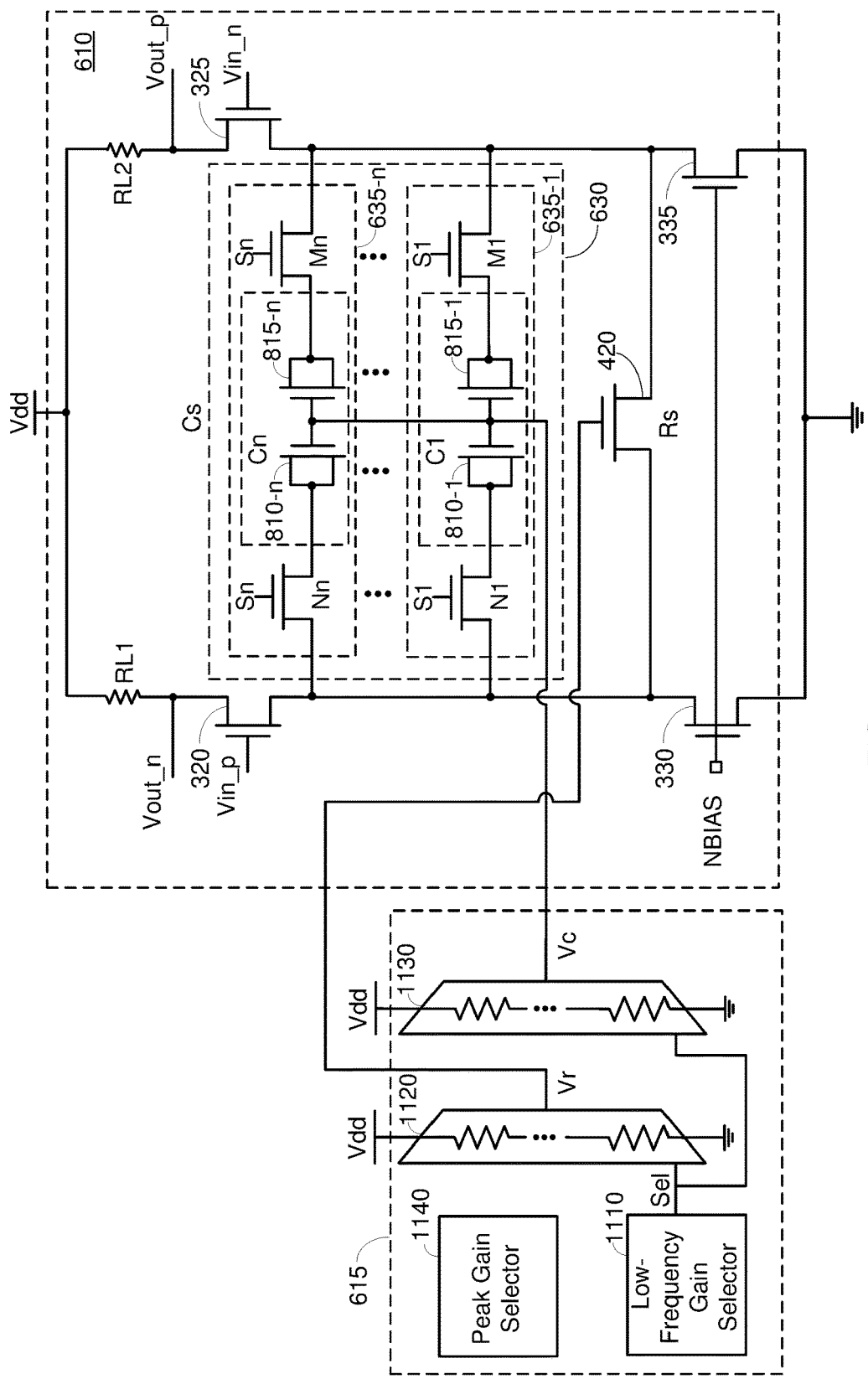
FIG. 11 shows an exemplary implementation of a controller according to certain aspects of the present disclosure.

FIG. 11 shows an exemplary implementation of the controller 615 according to certain aspects. In this example, the controller 615 includes a low-frequency gain selector 1110, a first digital-to-analog (DAC) 1120, a second DAC 1130, and a peak gain selector 1140. The first DAC 1120 provides the bias voltage Vr for the NFET resistor 420, and the second DAC 1130 provides the bias voltage Vc for the capacitors C1 to Cn, as discussed further below.

The low-frequency gain selector 1110 is configured to output a digital select signal (denoted "Sel") indicating the selected low-frequency gain setting. The low-frequency gain selector 1110 may select the low-frequency gain setting based on, for example, the signal level of the signal received from the channel (e.g., channel 130). For example, if the signal level is low, the low-frequency gain selector 1110 may set the low-frequency gain high, and vice versa.

The first DAC 1120 is configured to receive the select signal Sel from the low-frequency gain selector 1110 indicating the selected low-frequency gain setting. The first DAC 1120 then sets the voltage level of the bias voltage Vr output by the first DAC 1120 according to the bias voltage Vr corresponding to the low-frequency gain setting indicated by the select signal Sel. The first DAC 1120 may be implemented using a resistor ladder (indicated by the resistors shown in FIG. 11), or another known structure.

The second DAC 1130 is also configured to receive the select signal Sel from the low-frequency gain selector 1110. The second DAC 1130 sets the voltage level of the bias voltage Vc output by the second DAC 1130 according to the bias voltage Vc corresponding to the low-frequency gain setting indicated by the select signal Sel. The second DAC 1120 may be implemented using a resistor ladder, or another known structure.

In this example, the low-frequency gain selector 1110 is configured to set the low-frequency gain of the amplifier 610 to any one of a plurality of different low-frequency gain settings, where each low-frequency gain setting has corresponding bias voltages Vr and Vc. When the low-frequency gain selector 1110 sets the low-frequency gain of the amplifier 610 to a particular low-frequency gain setting, the selector 1110 outputs a corresponding select signal Sel to the first and second DACs 1120 and 1130. The first DAC 1120 sets the voltage level of bias voltage Vr output by the first DAC 1120 according to the bias voltage Vr corresponding to the low-frequency gain setting, and the second DAC 1130 sets the voltage level of bias voltage Vc output by the second DAC 1130 according to the bias voltage Vc corresponding to the low-frequency gain setting.

In this example, the bias voltage Vc for each low-frequency gain setting may be chosen such that the RC product of the NFET resistor 420 and the capacitor network 630 for the maximum switch setting stays within a certain RC range across the plurality of low-frequency gain settings. For example, the RC range may ensure that the peak gain for the maximum switch setting does not shift into the mid-frequency band for the minimum low-frequency setting.

In this example, the bias voltage Vc is adjusted based on the low-frequency gain setting, and may be independent of the switch setting of the capacitor network 630. Thus, the amount of reduction to changes in the RC product may be different for different switch settings of the capacitor network 630. By choosing bias voltages Vc for the low-frequency gain settings that keep the peak gain for the maximum switch setting out of the mid-frequency, the peak gains for the other switch settings are also kept out of the mid-frequency band. This is because the peak gain for the maximum switch setting is located the farthest to the left on the frequency axis.

The peak gain selector 1140 is configured to set the peak gain of the amplifier 610 to any one of a plurality of peak gain settings, in which each peak gain setting corresponds to a different switch setting (i.e., different number of capacitors C1 to Cn switched into the capacitor network 630). In this example, the peak gain selector 1140 sets the amplifier 610 to a particular peak gain setting by switching the corresponding number of the capacitors C1 to Cn into the capacitor network 630. The peak gain selector 1140 switches the corresponding capacitors into the capacitor network 630 by closing the respective switches in the capacitor network 630, as discussed above. For ease of illustration, the individual connections between the peak gain selector 1140 and the switches N1 to Nn and M1 to Mn are not explicitly shown in FIG. 11.

In the example in FIG. 11, both the first and second DACs 1120 and 1130 are powered by the supply voltage Vdd. If the bias voltage Vc to the capacitors C1 to Cn is approximately equal to or below the bias voltage Vr to the NFET resistor 420 across the adjustable (tunable) range of the low-frequency gain, then it is possible to power the second DAC 1130 with the bias voltage Vr instead of the supply voltage Vdd.

Figure 12:
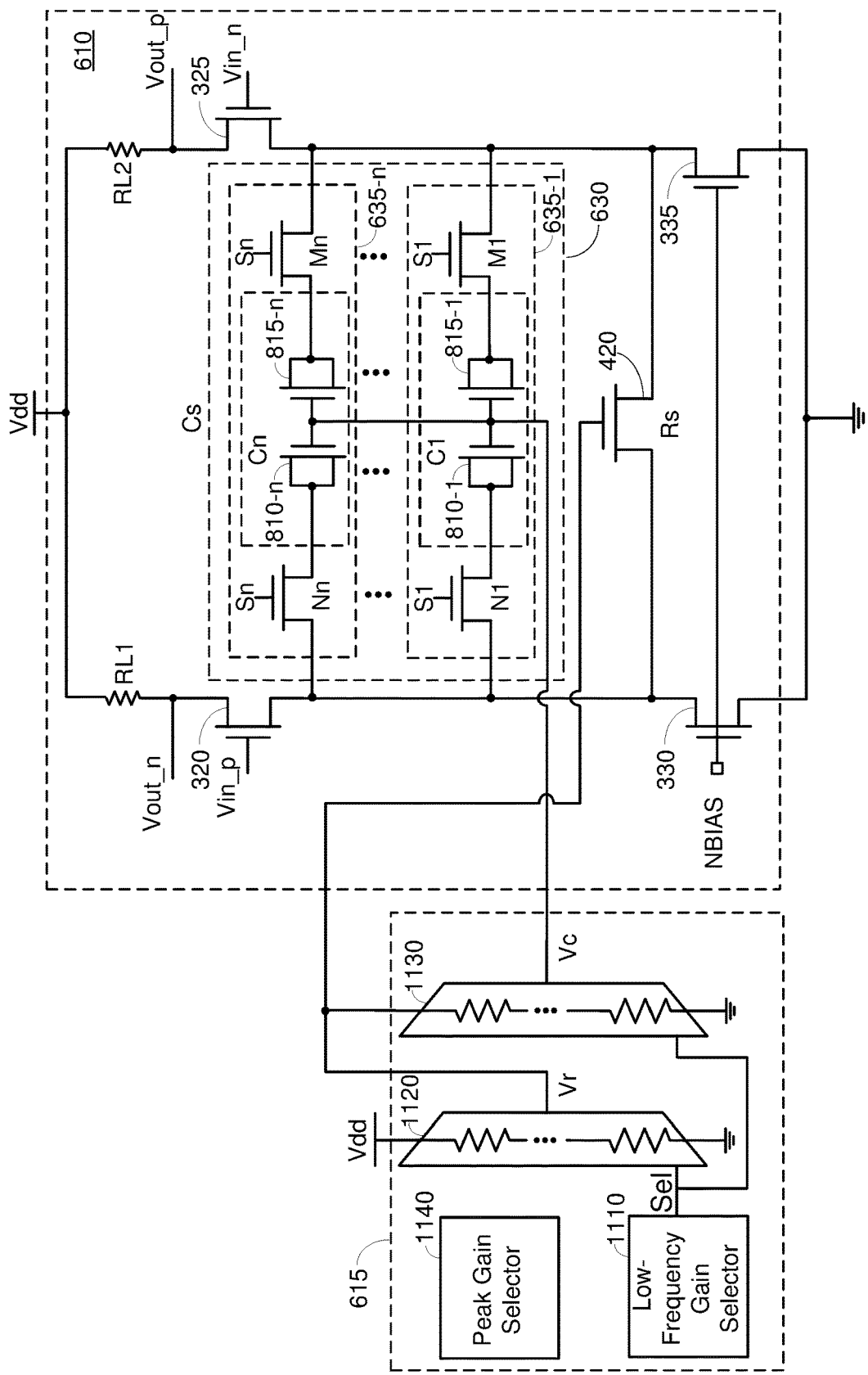
FIG. 12 shows another exemplary implementation of the controller according to certain aspects of the present disclosure.

In this regard, FIG. 12 shows an example in which the first DAC 1120 is powered by the supply voltage Vdd, and the second DAC 1130 is powered by the bias voltage Vr to the NFET resistor 420. In this example, the bias voltage Vc to the capacitors C1 and Cn and the bias voltage Vr to the NFET resistor 420 both decrease as the low-frequency gain of the amplifier 610 is decreased. The bias voltage Vc may decrease at a faster rate than the bias voltage Vr as the low-frequency gain of the amplifier 610 is decreased. As a result, bias voltage Vc stays below bias voltage Vr as the low-frequency gain is decreased, making it possible for the second DAC 1130 (which outputs bias voltage Vc) to be powered by the bias voltage Vr output by the first DAC 1120, as shown in FIG. 12.

In one example, the bias voltage Vc may be a scaled down version of the bias voltage Vr. In this example, for each one of the different low-frequency gain settings, the second DAC 1130 may be configured to scale down the corresponding bias voltage Vr output by the first DAC 1120 to generate the corresponding bias voltage Vc.

In one example, the bias voltages Vr and Vc may be approximately the same for the maximum low-frequency gain setting. For example, both bias voltages Vr and Vc may be approximately equal to Vdd for the maximum low-frequency gain setting. For the remaining low-frequency gain settings, the bias voltage Vc may be a scaled down version of bias voltage Vr, as discussed above.

Figure 13:
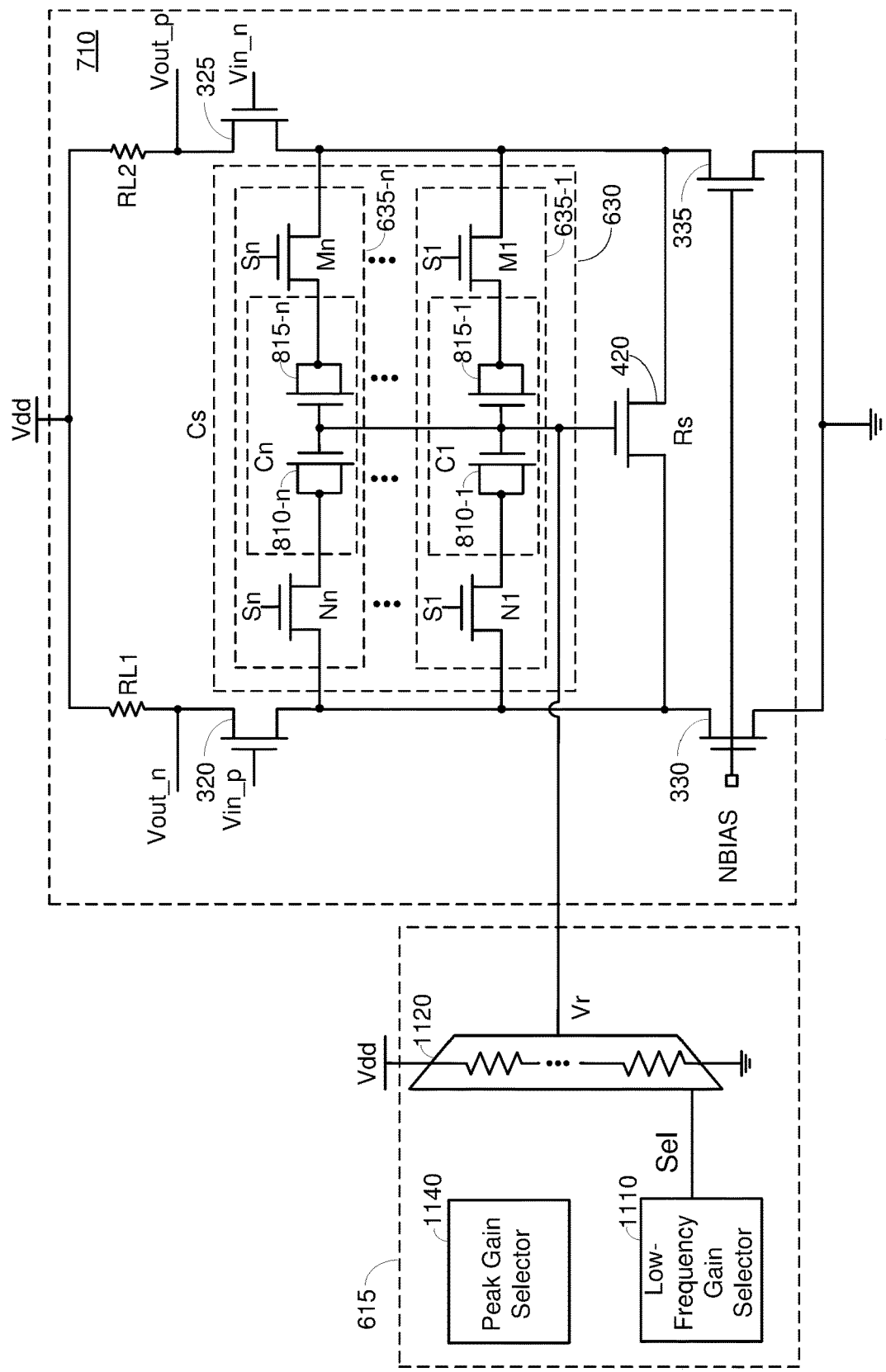
FIG. 13 shows still another exemplary implementation of the controller according to certain aspects of the present disclosure.

In certain aspects, the bias voltage Vr to the NFET resistor 420 is also used to bias the capacitors C1 to Cn in the capacitor network 630. In this regard, FIG. 13 shows an example in which the bias voltage Vr output by the first DAC 1120 is also used to bias the gates of the NFETs 810-1 to 810-n and 815-1 to 815-n of the capacitors C1 to Cn in the capacitor network 630. In this example, the second DAC 1130 is omitted, which reduces the area and power consumption of the controller 615.

Using the bias voltage Vr to bias the capacitors C1 to Cn in the capacitor network 630 reduces the amount of changes in the RC product compared with the capacitor network 430 in FIG. 4, in which the capacitances of the capacitors are fixed. This is because the resistance of the NFET resistor 420 and the capacitances of the capacitors C1 to Cn respond in the opposite direction to changes in the bias voltage Vr. The controller in this example may not be able to achieve the same amount of reduction in variation of the RC product compared with the examples in which the capacitances of the capacitors C1 to Cn are controlled by a separate bias voltage Vc. However, the amount of reduction in variation of the RC product that can be achieved in this example may be sufficient in some applications to prevent the peak gain for the maximum switch setting from move into the mid-frequency band, and therefore sufficient to prevent mid-band humps.

Figure 14:
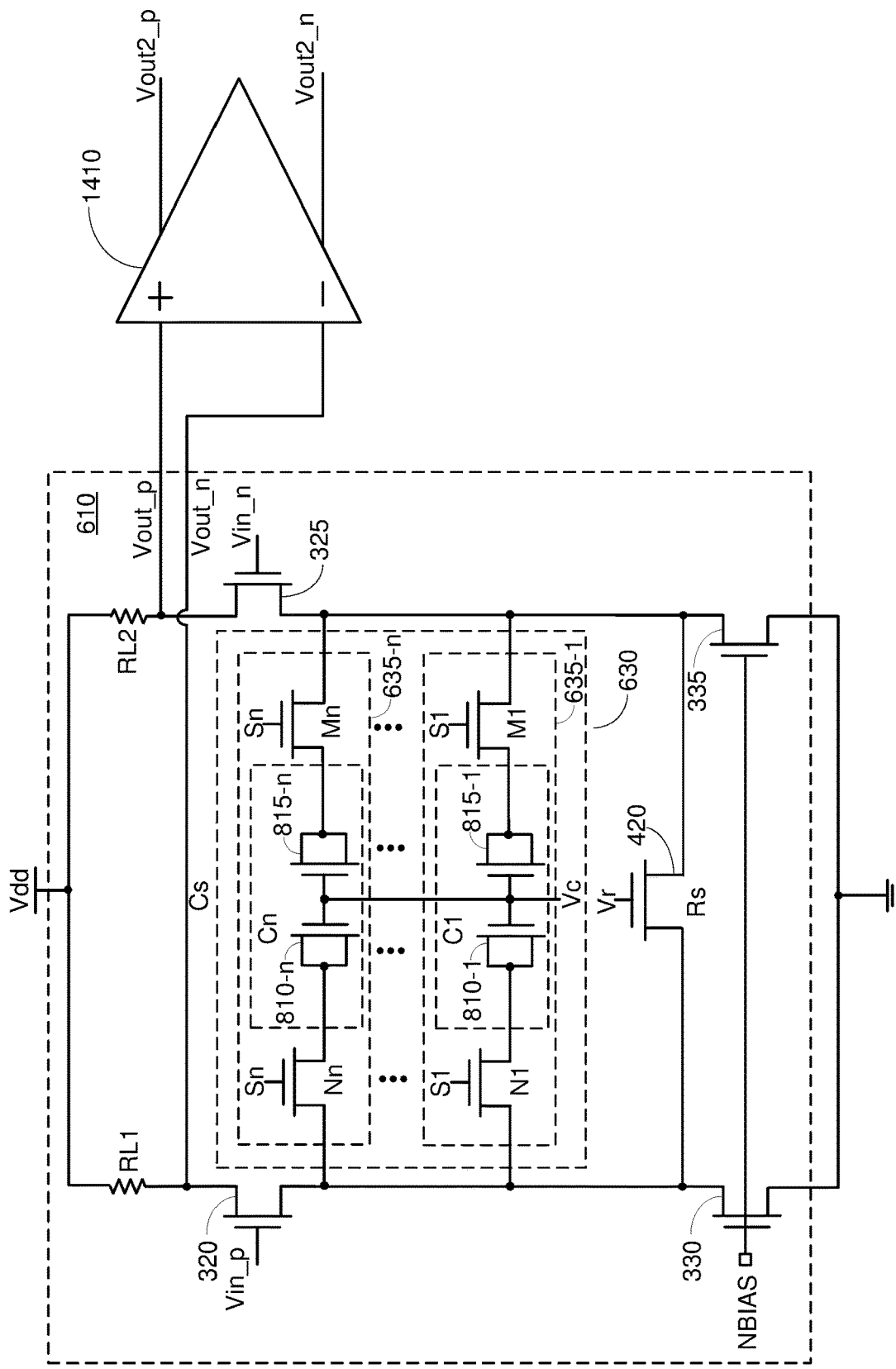
FIG. 14 shows an example in which the variable gain amplifier is coupled to an additional amplifier according to certain aspects of the present disclosure.

In certain aspects, the amplifier 610 may be coupled to one or more additional amplifier stages in the receiver (e.g., receiver 150). For example, FIG. 14 shows an example in which the differential output (Vout_p and Vout_n) of the amplifier 610 is coupled to the differential input of a second amplifier 1410. The second amplifier 1410 may provide additional gain peaking, as discussed further below. The differential output (Vout2_p and Vout2_n) of the second amplifier 1410 may be provided to subsequent stages in the receiver for further processor.

As discussed above, the second amplifier 1410 may provide additional gain peaking for the received signal. For example, the second amplifier 1410 may include inductive loads with adjustable inductances, in which the inductances of the inductive loads may be adjusted to adjust the amount of the additional gain peaking. Thus, the peak gain setting of the second amplifier 1410 in this example is adjusted by adjusting the inductances of the inductive loads in the second amplifier. The total peak gain of the amplifiers 610 and 1410 may be adjusted by adjusting the switch setting of the capacitor network 630 and/or the peak gain setting of the second amplifier 1410. In this example, the total peak gain of the amplifiers 610 and 1410 may be set to compensate for signal attenuation of the channel (e.g., channel 130) at high frequencies to provide an approximately flat combined frequency response over a desired frequency band.

Figure 15:
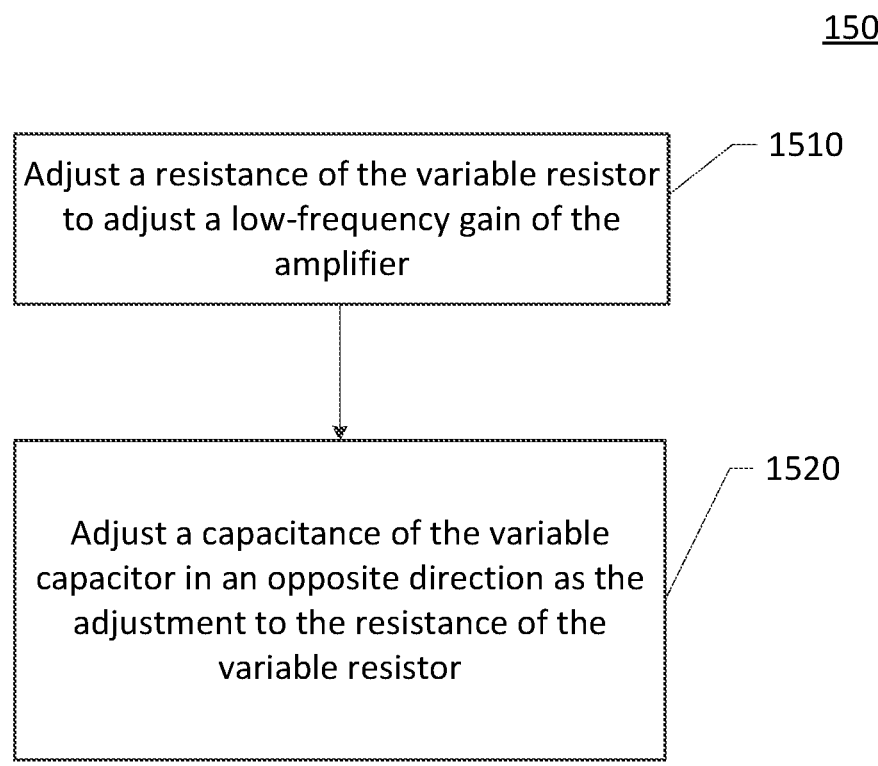
FIG. 15 is a flowchart illustrating a method for operating an amplifier according to certain aspects of the present disclosure.

FIG. 15 is a flowchart illustrating a method 1500 for operating an amplifier according to certain aspects of the present disclosure. The amplifier (e.g., amplifier 610) includes a variable resistor (e.g., resistor Rs) coupled between a source of a first input transistor (e.g., input NFET 320) and a source of a second input transistor (e.g., input NFET 325), and a variable capacitor (e.g., capacitor Cs) coupled between the source of the first input transistor and the source of the second input transistor. The method 1500 may be performed by the controller 615.

At step 1510, the controller 615 adjusts a resistance of the variable resistor to adjust a low-frequency gain of the amplifier. For example, the resistor may comprise a field effect transistor (FET) resistor (e.g., NFET resistor 420). In this example, the controller 615 may adjust the resistance of the FET resistor by adjusting a first control voltage (e.g., bias voltage Vr) applied to a gate of the FET resistor.

At step 1520, the controller 615 adjusts a capacitance of the variable capacitor in an opposite direction as the adjustment to the resistance of the variable resistor. For example, if the resistance of the variable resistor is increased to reduce the low-frequency gain, then the controller 615 decreases the capacitance of the variable capacitor. Adjusting the capacitance of the variable capacitor in the opposite direction as the adjustment to the resistance of the variable resistor reduces the change in the resistance-capacitance (RC) product of the variable resistor and the variable capacitor, as discussed above. In certain aspect, the change in the RC product may be reduced to approximately zero, in which case, the controller 615 adjusts the capacitance of the variable capacitor in the opposite direction of the adjustment in the resistance of the variable resistance such the RC product is kept approximately fixed. In one example, the variable capacitor includes one or more voltage-dependent capacitors (e.g., capacitors C1 and Cn in FIG. 8). In this example, the controller 615 adjusts the capacitance of the variable capacitor by adjusting a second control voltage (e.g., bias voltage Vc) applied to the one or more voltage-dependent capacitors.

It is to be appreciated that steps 1510 and 1520 may be performed concurrently, or that the order of steps 1510 and 1520 may be reversed.

The controller 415 or 615, the low-frequency gain selector 1110, and the peak gain selector 1140 according to any of the embodiments discussed above may be implemented with a general-purpose processor, a digital signal processor (DSP), an application specific integrated circuit (ASIC), a field programmable gate array (FPGA) or other programmable logic device, discrete hardware components, or any combination thereof designed to perform the functions described herein. A general-purpose processor may be a microprocessor, but in the alternative, the processor may be any conventional processor, controller, microcontroller, or state machine. A processor may perform the functions described herein by executing software comprising code for performing the functions. The software may be stored on a computer-readable storage medium, such as a RAM, a ROM, an EEPROM, an optical disk, and/or a magnetic disk.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

The invention claimed is:

1. A system, comprising:
   an amplifier, comprising
     a first input transistor;
     a first load coupled between a drain of the first input transistor and a supply voltage;
     a second input transistor;
     a second load coupled between a drain of the second input transistor and the supply voltage;

a variable resistor coupled between a source of the first input transistor and a source of the second input transistor; and
a variable capacitor coupled between the source of the first input transistor and the source of the second input transistor; and
a controller configured to adjust a resistance of the variable resistor to adjust a low-frequency gain of the amplifier for frequencies below a zero location of the amplifier, and to adjust a capacitance of the variable capacitor in an opposite direction as the adjustment to the resistance of the variable resistor such that the capacitance of the variable capacitor is decreased if the resistance of the variable resistor is increased, and the capacitance of the variable capacitor is increased if the resistance of the variable resistor is decreased in order to reduce variation in an RC product of the resistance value R of the variable resistor and the capacitance value C of the variable capacitor.

2. The system of claim 1, wherein the variable resistor comprises a field effect transistor (FET) resistor, and the controller is configured to adjust the resistance of the variable resistor by adjusting a first control voltage applied to a gate of the FET resistor.

3. The system of claim 2, wherein the variable capacitor comprises one or more voltage-dependent capacitors, and the controller is configured to adjust the capacitance of the variable capacitor by adjusting a second control voltage applied to the one or more voltage-dependent capacitors.

4. The system of claim 3, wherein the controller is configured to adjust the first and second control voltages in a same direction.

5. The system of claim 4, wherein the controller is configured to increase the second control voltage if the first control voltage is increased, and to decrease the second control voltage if the first control voltage is decreased.

6. The system of claim 3, wherein the controller comprises:
a low-frequency gain selector configured to output a select signal indicating a selected one of a plurality of different-frequency gain settings;
a first digital-to-analog converter (DAC) configured to receive the select signal, and to set a voltage level of the first control voltage according to the selected one of the plurality of different low-frequency gain settings; and
a second DAC configured to receive the select signal, and to set a voltage level of the second control voltage according to the selected one of the plurality of different low-frequency gain settings.

7. The system of claim 6, wherein the first control voltage is input to the second DAC to power the second DAC.

8. The system of claim 3, wherein each of the one or more voltage-dependent capacitors comprises a FET having a gate configured to receive the second control voltage, and a source and a drain tied together and coupled to the source of one of the first and second input transistors.

9. The system of claim 2, wherein the variable capacitor comprises one or more voltage-dependent capacitors, and the first control voltage is also applied to the one or more voltage-dependent capacitors to adjust the capacitance of the variable capacitor.

10. The system of claim 9, wherein each of the one or more voltage-dependent capacitors comprises a FET having a gate configured to receive the first control voltage, and a source and a drain tied together and coupled to the source of one of the first and second input transistors.

11. The system of claim 1, wherein the variable capacitor comprises:
a plurality of voltage-dependent capacitors; and
a plurality of switches configured to selectively couple each of the voltage-dependent capacitors to the sources of the first and second input transistors;
wherein the controller is configured to selectively turn on two or more of the plurality of switches to couple a number of the voltage-dependent capacitors to the sources of the first and second input transistors based on a selected one of a plurality of peak gain settings, and to adjust the capacitance of the variable capacitor in the opposite direction as the adjustment to the resistance of the variable resistor by adjusting a control voltage applied to the voltage dependent capacitors.

12. The system of claim 1, wherein the controller is further configured to adjust the resistance of the variable resistor with a maximum capacitor setting of the variable capacitor such that the RC product is maintained within an RC range across a tunable range of the low-frequency gain.

13. A method for operating an amplifier, the amplifier including a variable resistor coupled between a source of a first input transistor and a source of a second input transistor, and a variable capacitor coupled between the source of the first input transistor and the source of the second input transistor, the method comprising:
adjusting a resistance of the variable resistor to adjust a low-frequency gain of the amplifier for frequencies below a zero location of the amplifier; and
adjusting a capacitance of the variable capacitor in an opposite direction as the adjustment to the resistance of the variable resistor such that the capacitance of the variable capacitor is decreased if the resistance of the variable resistor is increased, and the capacitance of the variable capacitor is increased if the resistance of the variable resistor is decreased in order to reduce variation in an RC product of the resistance value R of the variable resistor and the capacitance value C of the variable capacitor.

14. The method of claim 13, wherein the variable resistor comprises a field effect transistor (FET) resistor, and adjusting the resistance of the variable resistor comprises adjusting a first control voltage applied to a gate of the FET resistor.

15. The method of claim 14, wherein the variable capacitor comprises one or more voltage-dependent capacitors, and adjusting the capacitance of the variable capacitor comprises adjusting a second control voltage applied to the one or more voltage-dependent capacitors.

16. The method of claim 15, wherein the first and second control voltages are adjusted in a same direction.

17. The method of claim 16, wherein adjusting the second control voltage applied to the one or more voltage-dependent capacitors comprises increasing the second control voltage if the first control voltage is increased, and decreasing the second control voltage if the first control voltage is decreased.

18. The method of claim 15, wherein each of the one or more voltage-dependent capacitors comprises a FET having a gate configured to receive the second control voltage, and a source and a drain tied together and coupled to the source of one of the first and second input transistors.

19. The method of claim 14, wherein the variable capacitor comprises one or more voltage-dependent capacitors, and adjusting the capacitance of the variable capacitor comprises applying the first control voltage to the one or more voltage-dependent capacitors.

20. The method of claim 19, wherein each of the one or more voltage-dependent capacitors comprises a FET having a gate configured to receive the first control voltage, and a source and a drain tied together and coupled to the source of one of the first and second input transistors.

21. The method of claim 13, wherein the variable capacitor comprises a plurality of voltage-dependent capacitors, and the method further comprises:
coupling a number of the voltage-dependent capacitors to the sources of the first and second input transistors based on a selected one of a plurality of peak gain settings;
wherein adjusting the capacitance of the variable capacitor in the opposite direction as the adjustment to the resistance of the variable resistor comprises adjusting a control voltage applied to the voltage-dependent capacitors.

22. The method of claim 13, further comprising:
adjusting the resistance of the variable resistor with a maximum capacitor setting of the variable capacitor such that the RC product is maintained within an RC range across a tunable range of the low-frequency gain.

23. An apparatus for operating an amplifier, the amplifier including a variable resistor coupled between a source of a first input transistor and a source of a second input transistor, and a variable capacitor coupled between the source of the first input transistor and the source of the second input transistor, the apparatus comprising:
means for adjusting a resistance of the variable resistor to adjust a low-frequency gain of the amplifier for frequencies below a zero location of the amplifier, wherein the variable resistor comprises a field effect transistor (FET) resistor, and the means for adjusting the resistance of the variable resistor comprises means for adjusting a first control voltage applied to a gate of the FET resistor; and
means for adjusting a capacitance of the variable capacitor in an opposite direction as the adjustment to the resistance of the variable resistor;
wherein the means for adjusting the capacitance of the variable capacitor in the opposite direction as the adjustment to the resistance of the variable resistor comprises means for decreasing the capacitance of the variable capacitor if the resistance of the variable resistor is increased, and means for increasing the capacitance of the variable capacitor if the resistance of the variable resistor is decreased in order to reduce variation in an RC product of the resistance value R of the variable resistor and the capacitance value C of the variable capacitor.

24. The apparatus of claim 23, wherein the variable resistor comprises a field effect transistor (FET) resistor, and the means for adjusting the resistance of the variable resistor comprises means for adjusting a first control voltage applied to a gate of the FET resistor.

25. The apparatus of claim 24, wherein the variable capacitor comprises one or more voltage-dependent capacitors, and the means for adjusting the capacitance of the variable capacitor comprises means for adjusting a second control voltage applied to the one or more voltage-dependent capacitors.

26. The apparatus of claim 25, wherein the first and second control voltages are adjusted in a same direction.

27. The apparatus of claim 26, wherein the means for adjusting the second control voltage applied to the one or more voltage-dependent capacitors comprises means for increasing the second control voltage if the first control voltage is increased, and means for decreasing the second control voltage if the first control voltage is decreased.

28. The apparatus of claim 24, wherein the variable capacitor comprises one or more voltage-dependent capacitors, and the means for adjusting the capacitance of the variable capacitor comprises means for applying the first control voltage to the one or more voltage-dependent capacitors.

29. The apparatus of claim 23, wherein the variable capacitor comprises a plurality of voltage-dependent capacitors, and the apparatus further comprises:
means for coupling a number of the voltage-dependent capacitors to the sources of the first and second input transistors based on a selected one of a plurality of peak gain settings;
wherein the means for adjusting the capacitance of the variable capacitor in the opposite direction as the adjustment to the resistance of the variable resistor comprises means for adjusting a control voltage applied to the voltage-dependent capacitors.

30. The apparatus of claim 23, wherein the means for adjusting the resistance of the variable resistor includes means for adjusting the resistance of the variable resistor with a maximum capacitor setting of the variable capacitor such that the RC product is maintained within an RC range across a tunable range of the low-frequency gain.

* * * * *